United States Patent
Kobayashi

(10) Patent No.: US 6,821,929 B2
(45) Date of Patent: Nov. 23, 2004

(54) METHOD FOR PRODUCING OXIDE SUPERCONDUCTING WIRE

(75) Inventor: Shin-ichi Kobayashi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 212 days.

(21) Appl. No.: 10/221,130

(22) PCT Filed: Dec. 28, 2001

(86) PCT No.: PCT/JP01/11673

§ 371 (c)(1),
(2), (4) Date: Sep. 10, 2002

(87) PCT Pub. No.: WO02/056319

PCT Pub. Date: Jul. 18, 2002

(65) Prior Publication Data

US 2003/0027723 A1 Feb. 6, 2003

(30) Foreign Application Priority Data

Jan. 15, 2001 (JP) .......................................... 2001-6473

(51) Int. Cl.⁷ ........................ H01B 12/10; H01B 13/00; B21F 19/00
(52) U.S. Cl. ........................................ 505/433; 29/599
(58) Field of Search ................................. 505/430, 433; 29/599; 174/125.1

(56) References Cited

U.S. PATENT DOCUMENTS

| 5,942,466 A | 8/1999 | Li et al. |
| 6,375,768 B1 * | 4/2002 | Goyal .......................... 148/519 |
| 6,455,166 B1 * | 9/2002 | Truchan et al. ............. 428/471 |

FOREIGN PATENT DOCUMENTS

| JP | 63-225412 A | 9/1988 |
| JP | 3-51105 A | 3/1991 |
| JP | 04-269407 A | 9/1992 |
| JP | 05-151843 A | 6/1993 |
| WO | WO 97/48123 | 12/1997 |

* cited by examiner

Primary Examiner—Mark Kopec
(74) Attorney, Agent, or Firm—Foley & Lardner LLP

(57) ABSTRACT

A method of manufacturing an oxide superconducting wire, through which dimensional precision of width or thickness of the wire can be improved and an oxide superconducting wire with high superconducting performance can be obtained, is provided. The method of manufacturing the oxide superconducting wire includes preparing a composite by covering with metal powder containing an oxide superconductor or raw material for an oxide superconductor, and rolling the composite using a lubricant having kinematic viscosity of $20 \times 10^{-6}$ mm²/s or smaller.

14 Claims, 8 Drawing Sheets

METHOD FOR PRODUCING OXIDE SUPERCONDUCTING WIRE

TECHNICAL FIELD

The present invention relates to a method of manufacturing an oxide superconducting wire, and specifically, to a method of manufacturing an oxide superconducting wire including a step of rolling a composite prepared by covering with metal powder containing an oxide superconductor or raw material for an oxide superconductor.

BACKGROUND ART

Conventionally, in general, when manufacturing a superconducting wire consisting of a composite in which an oxide superconductor is covered with metal, firstly oxide powder as a raw material for superconductor is filled in a metal pipe of silver or the like to fabricate a composite of monofilamentary structure (a monofilamentary composite). Thereafter, a plurality of the monofilamentary composites are bundled and inserted into another metal pipe to fabricate a composite of multifilamentary structure (a multifilamentary composite). On the multifilamentary composite, workings such as drawing or rolling are performed to obtain a tape-shaped wire. Through a thermal treatment of such tape-shaped wire, a wire with superconduction can be obtained.

In the superconducting wire thus manufactured, properties of interest in practical use are superconduction such as critical temperature or critical current value. In addition, improvement of dimensional precision of the wire is nevertheless important.

The above mentioned superconducting wire are practically used as implemented in a magnet or a cable. As a magnet, a coil form with a tape-shaped oxide superconducting wire being rolled as a pancake, as well as a stacked structure of such coils are employed to utilize the magnetic field generated at the center when a current is applied to the superconducting wire. As a cable, a structure in which a tape-shaped oxide superconducting wire is wound around the outside of a cylindrical tube is employed. If a tape-shaped superconducting wire is not uniform in width or thickness, then in the magnet form, aligned winding is hindered and thus the shape of the coil is degraded, and additionally, in the cable form, the superconducting wires are overlaid with each other and thus superconducting properties are degraded by the resulting stress. Therefore, in order to obtain desired superconducting properties when forming the superconducting wire into a magnet or a cable, it is important to improve dimensional precision in width and thickness of the tape-shaped superconducting wire.

One manufacturing method for solving above mentioned problems is proposed in Japanese Patent No. 2,951,423 (Japanese Patent Laying-Open No. 4-269407) (Prior Invention 1). In Prior Invention 1, a method is employed in which a composite, obtained by filling a ceramic material for a superconductor in a metal pipe, is compression molded using a press-type pressure jig. By utilizing the pressure jig to constrain the width of the composite while working, the variation in width of the superconducting wire eventually obtained is eliminated.

Another manufacturing method for solving above mentioned problems is proposed in International Publication WO97/48123 (Prior Invention 2). In Prior Invention 2, it is proposed to use various lubricant for roll working a composite with small coefficient of friction of 0.2 or smaller to improve dimensional precision of a superconducting wire.

With the manufacturing method of Prior Invention 1, if width dimension of the composite is not precise before being compression formed by the pressure jig having grooves for constraining the width thereof, then desired shape of superconducting wire can not be obtained at the last stage. For example, if width dimension of the composite before passing through the pressure jig is larger than, or close to, that of the grooves of the pressure jig, then edges in width direction of the composite (width-direction edges) will be deformed after being compression molded by the pressure jig. This may result in formation of protrusions on width-direction edges of the superconducting wire eventually obtained, or generation of breaks such as cracks in oxide superconducting filaments within the superconducting wire. In some parts of a composite where the width dimension before passing through the pressure jig is smaller than that of the grooves of the pressure jig, certain portions on width-direction edges of the composite do not abut on the side of the grooves of the pressure jig while being worked with it. Further, in this method, the composite is intermittently compression formed, resulting in joints existing between worked parts. There is a problem that at such joints, performance of the superconducting part within the wire is degraded.

In the manufacturing method of Prior Invention 2, use of various lubricants to reduce coefficient of friction is proposed. However, there has been problems that, depending on the type of the lubricant, rolling the composite with the lubricant may result in cracks at width-direction edges (edge cracking) of the superconducting wire eventually obtained, or may degrade precision of the dimension.

The above mentioned problems attribute to the fact that the oxide superconducting wire is not formed with a single material, but with a composite of an oxide and a metal. For example, a composite of multifilamentary structure contains, in silver of about 100 to 150 Hv in hardness, 60 to 80 filaments formed with aggregated oxide powder having particle diameter of about 10 $\mu$m. The hardness of such filaments vary in a range of 50 to 100 Hv before being rolled. Because of the variety of hardness among the filaments and the difference of hardness between the filaments and silver, dimensional precision is hard to be improved by roll working. Even if dimensional precision is improved, there still remain problems such as generation of breaks in the filaments within the wire.

Therefore, it is an object of the present invention to provide a method of manufacturing an oxide superconducting wire, in which dimensional precision of width or thickness of the wire can be improved and a superconducting wire with high superconducting performance can be obtained.

DISCLOSURE OF THE INVENTION

A method of manufacturing an oxide superconducting wire according to the present invention includes the step of preparing a composite formed of powder containing an oxide superconductor or raw material for an oxide superconductor covered with metal, and the step of rolling the composite using a lubricant having kinematic viscosity of at most $20 \times 10^{-6}$ mm$^2$/s.

In a manufacturing method of the present invention, by rolling the composite using a lubricant having low kinematic viscosity of at most $20 \times 10^{-6}$ mm$^2$/s or smaller, formation of cracks can be prevented in the edges of wires eventually obtained, thus dimensional precision of the wire can be improved.

In a manufacturing method of the present invention, kinematic viscosity is preferably at most $10 \times 10^{-6}$ mm$^2$/s.

Further, in a manufacturing method of the present invention, the lubricant preferably has a boiling point of at most 200° C. In the present case, by utilizing highly volatile lubricant, the lubricant is volatilized by a processing heat generated upon roll working, then latent heat thereupon cools the pressure rolls. Thus, deformation of the pressure rolls can be prevented, and the rolling precision, and hence dimensional precision of the wire eventually obtained can further be improved.

Further, in a manufacturing method of the present invention, the step of rolling preferably includes rolling the composite with rolling reduction of at most 40%. In the present case, by gradually rolling the composite with small rolling reduction, dimensional precision of the wire eventually obtained can further be improved, especially the variation in dimension of the wire can be reduced.

In a manufacturing method of the present invention, the step of rolling preferably includes rolling the composite using a pressure rolls having grooves for constraining width of the composite. In the present case, dimensional precision of the wire eventually obtained, as well as the superconducting performance thereof, for example critical current value, can be improved.

Further, in a manufacturing method of the present invention, the step of performing roll working preferably includes rolling the composite with a four-directional pressure rolls. In this case, the composite is rolled while being constrained by upper, lower, right and left rolls, thus the rolling precision, and hence dimensional precision of the wire eventually obtained can further be improved.

In a manufacturing method of the present invention, the step of preparing a composite preferably includes filling into a metal pipe powder containing an oxide superconductor or raw material for an oxide superconductor.

Further, in a manufacturing method of the present invention, the step of preparing the composite preferably includes preparing a monofilamentary composite by filling into a first metal pipe powder containing an oxide superconductor or raw material for oxide superconductor, and preparing a multifilamentary composite by filling a plurality of monofilamentary composites into a second metal pipe. In the present case, the step of preparing composite further preferably includes drawing the monofilamentary composite, and the step of preparing the multifilamentary composite includes filling a plurality of drawn monofilamentary composite in the second metal pipe. In the present case, the step of preparing the composite further preferably includes drawing the multifilamentary composite.

In a manufacturing method of the present invention, a silver pipe or a silver alloy pipe is preferably employed as the metal pipe.

Further, in a manufacturing method of the present invention, an oxide superconductor is preferably a bithmuth-based oxide superconductor. The bithmuth-based oxide superconductor includes bithmuth, lead, strontium, calcium, and copper having a (bithmuth and lead):strontium:calcium:copper composition ratio approximately expressed as 2:2:2:3.

Further, a method of manufacturing an oxide superconducting wire of the present invention preferably further includes a step of thermally treating the rolled composite.

BEST MODES FOR CARRYING OUT THE INVENTION

Figure 1:
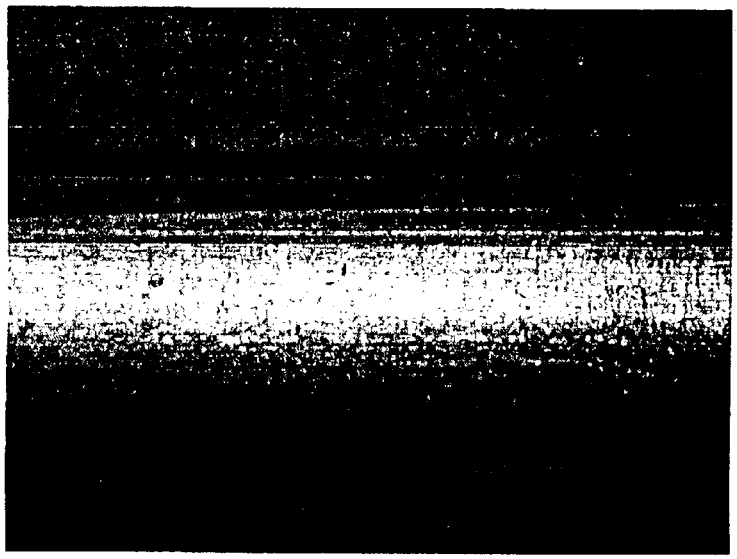
FIG. 1 is a micrograph showing a width-direction edge of an oxide superconducting wire manufactured according to the present invention.

In one embodiment of the present invention, a step of rolling a composite using a lubricant having kinematic viscosity of at most $20 \times 10^{-6}$ mm$^2$/s is employed. A method using a lubricant is effective for improving dimensional precision of an oxide superconducting wire eventually obtained, however, breaks called "edge cracking" may be generated at width-direction edges of the oxide superconducting wire eventually obtained, especially when a lubricant with high viscosity is used, due to effects of hardness or elongation of metal coverings and oxide filaments constituting the composite. The generation of such breaks not only degrades superconducting property of the superconducting wire, but eventually deprives it of the function as a superconducting wire. Thus, the lubricant used in the step of rolling must be low in viscosity. In order to prevent the generation of edge cracking in the edges of the oxide superconducting wire eventually obtained, a lubricant with a kinematic viscosity of at most $20\times10^{-6}$ mm$^2$/s must be selected.

Further, even if no edge cracking is generated at the edges of the superconducting wire, breaks of small width of about a few nm to a few μm might be generated at the edges of the superconducting wire. Such breaks are generated not only when the metal coating constituting the composite is silver, but also when it is a silver alloy. The superconducting wire with such breaks does not exhibit problems with dimensional precision. On the other hand, once the length of the composite as a subject of rolling exceeds 100 m, a phenomenon can be observed in which silver as a metal coating breaks into small dusts which in turn melt and adhere onto the surface of pressure rolls. Such melting phenomenon of silver onto the surface of the pressure rolls degrades precision in rolling, and hence, dimensional precision of the oxide superconducting wire eventually obtained. In order to prevent such phenomenon, kinematic viscosity of a lubricant used in the step of rolling must be at most $10\times10^{-6}$ mm$^2$/s.

Rolling of the composite generates heat. This processing heat also contributes to degradation of rolling precision. Since the processing heat gradually raises the temperature of the surface of the pressure rolls, they will be deformed. As such, gaps between the pressure rolls vary, and hence, the rolling precision varies.

In order to suppress the processing heat, generally known methods are to cool the pressure rolls with air or water, or to use hot rolls. When cooling pressure rolls with air or water, the entire pressure rolls are cooled, making it difficult to control subtle fluctuation in temperature of the surface of the pressure rolls. For example, when variation of width dimension of the superconducting wire eventually obtained is intended to be limited by 300 μm, cooling of pressure rolls with air or water can hardly suppress locally increasing temperature of the pressure rolls working on the composite. Further, when using hot rolls, since silver or silver alloy is used in the metal covering of the composite to be rolled, a problem arises that the metal covering is softened as the temperature of the pressure roll increases. The softened silver or silver alloy covering induces variation in the strength of the metal covering, and thus improvement of the rolling precision is hard to be achieved.

Therefore, in one example of manufacturing method of the present invention, a lubricant which has kinematic viscosity in the above mentioned range, and which is highly volatile is used. Especially, it is preferable to use a lubricant having boiling point of at most 200° C. as the highly volatile lubricant. When a highly volatile lubricant is used, the lubricant is volatilized by processing heat generated upon roll working, then latent heat thereupon cools the pressure rolls. Thus, locally increasing temperature of the pressure roll can be suppressed and thus gaps between pressure rolls are prevented from variation, and thus the rolling precision is improved. As a result, variation in dimension of width or thickness of the superconducting wire eventually obtained can further be reduced.

In a manufacturing method of the present invention, the rolling precision can be improved by using prescribed lubricant as above. To further improve the rolling precision, rolling reduction for rolling the composite into a tape-shaped superconducting wire must be reduced, where the rolling reduction is expressed as:

{(thickness before rolling)−(thickness after rolling)}×100/(thickness before rolling)[%].

For example, even when rolling reduction of 80% is required for processing a round shaped composite into a final tape-shaped wire, it is preferable to roll the composite stepwise with rolling reduction of at most 40%. By successively rolling the composite stepwise with rolling reduction of at most 40%, dimensional precision of the superconducting wire eventually obtained can be improved.

When performing roll working stepwise as above, it is preferable to provide grooves to the pressure rolls for constraining width of the composite in order to further improve dimensional precision of the superconducting wire. In this case, slight variation may be generated in the dimension of width when rolling, thus a narrow gap must be provided between the upper and lower pressure rolls. Especially, rolling with pressure rolls with grooves improves distribution of superconducting filaments in the cross section of the superconducting wire eventually obtained. Additionally in this case, one problem to be solved at the time of rolling is to improve density of the oxide superconducting filaments. This is required to improve the performance of superconducting portion of the wire. To meet the requirement, even when rolling is done stepwise using the grooved pressure roll, it is preferable to roll the composite using flat rolls as the pressure roll in the last step.

In one manufacturing method of the present invention, the rolling precision can further be improved by using a four-directional pressure roll at the last stage of roll working, for rolling the composite constraining both of its thickness and width. It should be noted that the variation of dimensional precision in width of the composite before being introduced in the four-directional pressure roll at the last step should be at most 300 μm. If the composite which varies in width more than 300 μm is introduced in the four-directional pressure roll, protrusions will be generated in the width-direction edges of the superconducting wire eventually obtained and thus dimensional precision is degraded, and additionally breaks will be generated in the superconducting filaments within the wire. As a result, the superconducting performance of the wire eventually obtained will be degraded. As such, working with the four-directional pressure roll for increasing density of the superconducting filaments is not preferable. Additionally, since the purpose of utilizing four-directional pressure rolls is not in densification of superconducting wire, the upper, lower, right and left rolls constituting the four-directional pressure rolls used herein are all preferably non-driving rolls.

(Embodiment)

FIRST EXAMPLE

The respective powders of oxide bithmuth ($Bi_2O_3$), lead monoxide (PbO), strontium carbonate ($SrCO_3$), calcium carbonate ($CaCO_3$), copper oxide (CuO) were mixed together to prepare powder having a Bi:Pb:Sr:Ca:Cu composition ratio of 1.82:0.33:1.92:2.01:3.02. The obtained powder was thermally treated at 750° C. for 10 hours, and then 800° C. for 8 hours to produce a sintered compact. The obtained sintered compact was crushed to powder using an automatic mortar. Next, the powder was thermally treated at 850° C. for 4 hours and then crushed again using the automatic mortar. The powder was further thermally treated at 800° C. for 2 hours, and then filled in a silver pipe having an outer diameter of 36 mm and an inner diameter of 30 mm. The silver pipe with the powder filled therein as a composite was drawn. Thus obtained 61 wires were bundled together, and then inserted into a silver pipe having an outer diameter of 36 mm and an inner diameter of 31 mm, which in turn was further drawn to a wire having a diameter of 1.5 mm. The wire was rolled to a target tape shape having a thickness of 0.26 mm and a width of 3.7 mm, and thus a wire as a composite with a length of 1000 m was manufactured.

In the above mentioned rolling step, lubricants with different viscosity were used. Eight types of lubricants, of which kinematic viscosities were respectively $150 \times 10^{-6}$ mm$^2$/s, $115 \times 10^{-6}$ mm$^2$/s, $45 \times 10^{-6}$ mm$^2$/s, $30 \times 10^{-6}$ mm$^2$/s, $20 \times 10^{-6}$ mm$^2$/s, $10 \times 10^{-6}$ mm$^2$/s, $5 \times 10^{-6}$ mm$^2$/s, $3 \times 10^{-6}$ mm$^2$/s, were prepared and each were used in rolling.

As a result, in the wire as the composite after being rolled with lubricants with kinematic viscosities of $150 \times 10^{-6}$ mm$^2$/s and $115 \times 10^{-6}$ mm$^2$/s, numerous breaks in width-direction edges (edge cracking) were generated. In the wire as the composite after being rolled with lubricants with kinematic viscosities of $45 \times 10^{-6}$ mm$^2$/s and $30 \times 10^{-6}$ mm$^2$/s, breaks (edge cracking) were generated in some part of width-direction edges. Further, rolling with a lubricant with kinematic viscosity of $20 \times 10^{-6}$ mm$^2$/s or lower, no breaks were observed in the appearance of the wire as the composite after being rolled.

Figure 2:
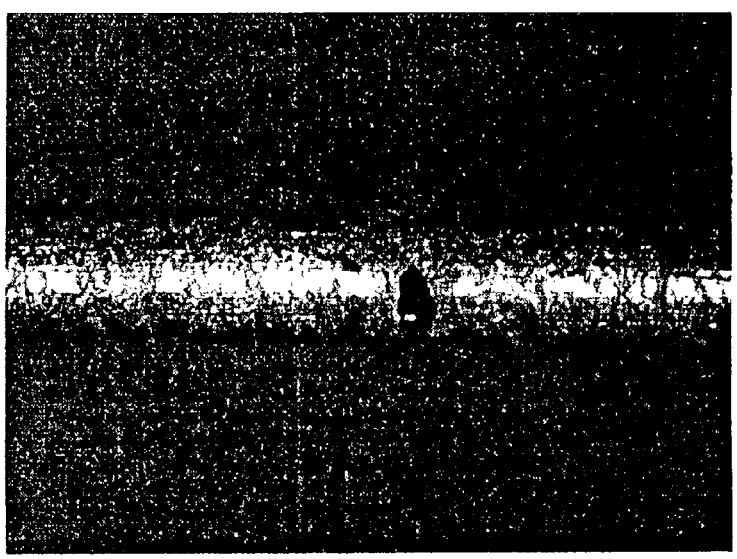
FIG. 2 is a micrograph showing a width-direction edge of an oxide superconducting wire with edge cracking as a comparative example to the present invention.

FIG. 1 is a micrograph (magnification of 64) showing magnified width-direction edges of the wire with no breaks. FIG. 2 is a micrograph (magnification of 64) showing magnified width-direction edges of the wire with breaks.

SECOND EXAMPLE

In the above mentioned rolling step of the first example, mineral oil of which kinetic velocity is in the range of $20 \times 10^{-6}$ mm$^2$/s to $3 \times 10^{-6}$ mm$^2$/s was used as a lubricant. The precision of the width and the thickness of the wire thus obtained were measured. The results are shown in Table 1.

cross section of the wire was polished and the oxide superconducting filaments were observed, and breaks were generated therein.

Figure 3:
FIG. 3 is a micrograph showing a cross section of an oxide superconducting wire with protrusions on edges of an oxide superconducting wire as a comparative example to the present invention.

FIG. 3 is a micrograph (magnification of 36) showing magnified width-direction edges of a tape-shaped oxide superconducting wire with protrusions. In FIG. 3, it can be appreciated that the width-direction edges are bulging, indicating formation of protrusions. The white part is a silver-covered portion, and the black part is the oxide superconducting filaments. In the cross section of the wire shown in FIG. 3, it can be seen that the oxide superconducting filaments are greatly deformed in width-direction edges.

From the above results, it can be appreciated that protrusions are formed in the width-direction edge, or breaks are generated in the oxide superconducting filaments when a wire, rolled with a lubricant having kinematic viscosity of $20 \times 10^{-6}$ mm$^2$/s, in other words, a wire with difference greater than 300 µm (500 µm) between the maximum and minimum values of the wire width dimension in the results of Table 1, is further rolled with its width constrained.

Figure 4:
FIG. 4 is a micrograph showing a cross section of an oxide superconducting wire of which superconducting filaments are broken as a comparative example to the present invention.
Figure 5:
FIG. 5 is a micrograph showing a longitudinal cross section of an oxide superconducting wire of which superconducting filaments are broken as a comparative example to the present invention.

FIG. 4 is a micrograph (magnification of 40) showing another cross section of a wire after being rolled with its width constrained, with the difference between the maximum and minimum values of the width of the wire exceeded 300 µm, in other words, the precision of the width dimension was more than 300 µm. As shown in FIG. 4, no protrusions are formed on width-direction edges as present in FIG. 3. On the other hand, at the middle portion in the width direction of the wire shown in FIG. 4, breaks are generated in some of the oxide superconducting filaments, indicating that the oxide superconducting filaments are broken. FIG. 5 is a micrograph (magnification of 75) showing longitudinal cross section of the wire of FIG. 4. As shown in FIG. 5, it can be appreciated that the breaks are also present in the oxide superconducting filaments in the longitudinal direction of the wire, that the filaments are broken and presenting fractured layers.

Figure 6:
FIG. 6 is a micrograph showing a longitudinal cross section of an oxide superconducting wire manufactured according to the present invention.

FIG. 6 is a micrograph (magnification of 75) showing longitudinal cross section of a wire after being rolled with its

TABLE 1

| kinematic viscosity ($\times 10^{-6}$ mm$^2$/s) | width (mm) | | | | thickness (mm) | | | |
|---|---|---|---|---|---|---|---|---|
| | average | standard deviation | maximum value | minimum value | average | standard deviation | maximum value | minimum value |
| 20 | 3.70 | 0.08 | 3.94 | 3.44 | 0.263 | 0.010 | 0.287 | 0.234 |
| 10 | 3.69 | 0.04 | 3.80 | 3.55 | 0.259 | 0.006 | 0.270 | 0.250 |
| 5 | 3.70 | 0.04 | 3.80 | 3.52 | 0.259 | 0.004 | 0.267 | 0.251 |
| 3 | 3.68 | 0.03 | 3.81 | 3.64 | 0.259 | 0.004 | 0.265 | 0.250 |

As seen from the results of Table 1, it can be appreciated that using lubricants having kinematic viscosity of $20 \times 10^{-6}$ mm$^2$/s or lower, dimensional precision of width and thickness of the wire can further be improved.

THIRD EXAMPLE

Each of the wires obtained by the second example were rolled with their width constrained by a four-directional pressure roll in which non-driving four rolls (upper, lower, right, and left rolls) were combined. The rolling reduction was 3%. The states of the wires after rolling were evaluated.

As a result, it was found that protrusions were formed in the width-direction edges only on the wire rolled using a lubricant with kinematic viscosity of $20 \times 10^{-6}$ mm$^2$/s. The width constrained. The difference between the maximum and minimum values of the width of the wire was 300 µm or smaller, in other words, the precision of the width dimension was 300 µm or smaller, more specifically, 50 µm. As shown in FIG. 6, no breaks are observed in the oxide superconducting filaments in the wire, and the filaments are extending along longitudinal direction of the wire without being broken.

As described above, the wires further rolled by the four-directional pressure rolls were thermally treated at 845° C. for 50 hours, respectively. Then, with rolling reduction of 18%, each wire was rolled further. Thereafter, each wire was thermally treated at 840° C. for 50 hours in the atmosphere.

The critical current density at 77 K was measured for each of the oxide superconducting wires thus obtained. As a result, only the wire which was subjected to the first roll working using the lubricant having kinematic viscosity of $20\times10^{-6}$ mm$^2$/s exhibited a critical current density half that of other oxide superconducting wires, or even smaller. It can be explained that at the stage of performing first roll working using the lubricant having kinematic viscosity of $20\times10^{-6}$ mm$^2$/s, breaks were generated in the oxide superconducting filaments within the wire, and thus only the wire exhibited low superconducting performance. As such, it can be appreciated that if the difference between maximum and minimum values of width dimension of the wire as a composite exceeds 300 μm before being rolled by the four-directional pressure roll with its width constrained, the subsequent roll working with its width constrained degrades superconducting performance.

FOURTH EXAMPLE

In the manufacturing method of the first example, a round shaped wire having a diameter of 1.5 mm was rolled to a tape-shaped wire having a thickness of 0.26 mm using a lubricant having kinematic viscosity of $3\times10^{-6}$ mm$^2$/s. In the roll working, the number of stages, in other words the frequency of passing the composite through the pressure rolls (pass frequency), was changed to examine effects on the rolling precision. When the pass frequency was once, a round shaped wire having a diameter of 1.5 mm was rolled to a tape-shaped wire having a thickness of 0.26 mm by pressure rolls with single stage. When the pass frequency was twice, a round shaped wire having a diameter of 1.5 mm was rolled to a tape-shaped wire having a thickness of 0.55 mm, and to a tape-shaped wire having a thickness of 0.26 mm, successively. When the pass frequency was four times, a round shaped wire having a diameter of 1.5 mm was rolled to a tape-shaped wire having a thickness of 0.9 mm, 0.6 mm, 0.4 mm, and 0.26 mm, successively. When the pass frequency was eight times, a round shaped wire having a diameter of 1.5 mm was rolled to a tape-shaped wire having a thickness of 1.3 mm, 0.9 mm, 0.75 mm, 0.6 mm, 0.5 mm, 0.4 mm, 0.3 mm, and 0.26 mm, successively.

The dimensional precision of width and thickness of the wires rolled with each pass frequency are shown in Table 2.

straint. Though no changes were observed in the variation between width or thickness of the worked wires, distributions of the oxide superconducting filaments in the cross section of the wires were improved. As a result, the critical current Ic which is one of the superconducting performance of the oxide superconducting wire exhibited improvement by 1.2 times at the liquid nitrogen temperature.

Figure 7:
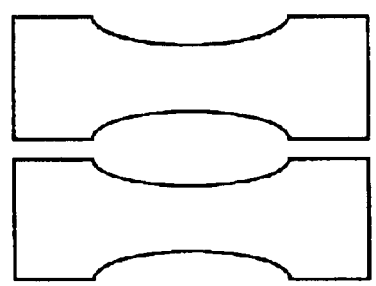
FIG. 7 illustrates as one embodiment outer profile of a cross section along axial direction of a pair of pressure rolls having grooves used in a manufacturing method of the present invention.

FIG. 7 shows schematic profile of the cross section along the axial direction of a pair of pressure rolls having grooves which is used in the manufacturing method of the present example. As shown in FIG. 7, elliptical grooves are formed at a central portion along the width direction of the rolls.

Figure 8:
FIG. 8 is a micrograph showing a cross section of an oxide superconducting wire obtained by roll working with flat rolls in an embodiment of the present invention.
Figure 9:
FIG. 9 is a micrograph showing a cross section of an oxide superconducting wire obtained by roll working with rolls having grooves in an embodiment of the present invention.

FIG. 8 is a micrograph (magnification of 46) showing cross section of an oxide superconducting wire obtained through roll working with flat rolls in the fourth example. FIG. 9 is a micrograph (magnification of 46) showing cross section of an oxide superconducting wire obtained through roll working with rolls having grooves in the fifth example. As shown in FIG. 8, distribution of the oxide superconducting filaments is not uniform. In contrast thereto, as shown in FIG. 9, the oxide superconducting filaments are optimally distributed over the width direction.

SIXTH EXAMPLE

Figure 10:
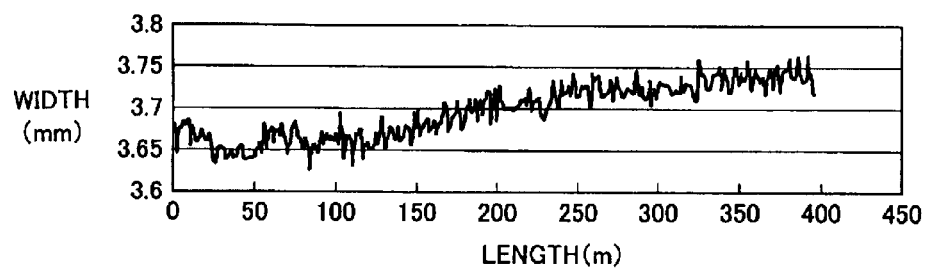
FIG. 10 is a graph showing changes in width against length of an oxide superconducting wire rolled using a lubricant of low volatility as an embodiment of the present invention.
Figure 11:
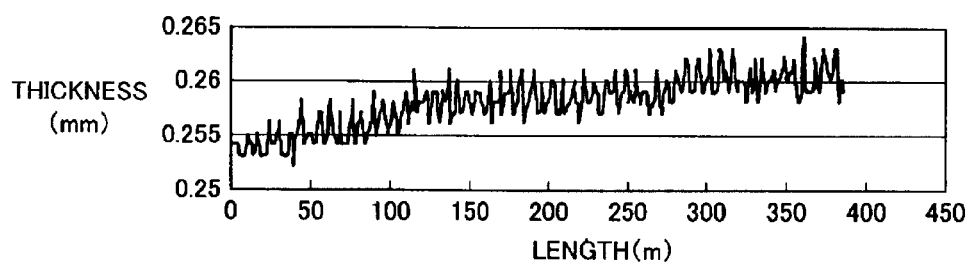
FIG. 11 is a graph showing changes in thickness against length of an oxide superconducting wire rolled using a lubricant of low volatility as an embodiment of the present invention.
Figure 12:
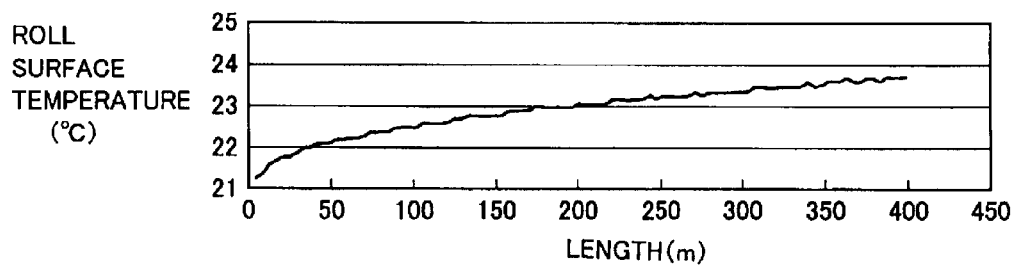
FIG. 12 is a graph showing changes in temperature of roll surface against length of an oxide superconducting wire rolled using a lubricant of low volatility as an embodiment of the present invention.

In the rolling step of the third example, roll working was performed using mineral oil having kinematic viscosity of $3\times10$ mm$^2$/s as a lubricant. Resulting, changes in width against length of the obtained oxide superconducting wire are shown in FIG. 10, changes in thickness against length of the oxide superconducting wire are shown in FIG. 11, changes in roll surface temperature against length of the oxide superconducting wire are shown in FIG. 12. From FIGS. 10 to 12, it can be appreciated that with a lubricant of low viscosity having kinematic viscosity of $3\times10^{-6}$ mm$^2$/s, the roll surface temperature also rises by the processing heat generated during the roll working of the composite, and correspondingly width or thickness of the obtained wire is affected.

In comparison, a highly volatile lubricant of which boiling point is about 200° C. and kinematic viscosity is $3\times10^{-6}$ mm$^2$/s was employed to perform roll working. Resulting

TABLE 2

| pass frequency | width (mm) | | | | thickness (mm) | | | |
| --- | --- | --- | --- | --- | --- | --- | --- | --- |
| | average | standard deviation | maximum value | minimum value | average | standard deviation | maximum value | minimum value |
| 1 | 3.68 | 0.03 | 3.81 | 3.64 | 0.259 | 0.004 | 0.265 | 0.250 |
| 2 | 3.70 | 0.03 | 3.80 | 3.65 | 0.260 | 0.004 | 0.265 | 0.252 |
| 4 | 3.69 | 0.02 | 3.77 | 3.67 | 0.259 | 0.001 | 0.263 | 0.255 |
| 8 | 3.70 | 0.02 | 3.78 | 3.67 | 0.260 | 0.001 | 0.263 | 0.256 |

From the results of Table 2, in the similar roll working in which a 5 round shaped wire having a diameter of 1.5 mm is rolled to a tape-shaped wire having an eventual thickness of 0.26 mm, variation of dimensional precision between the wires can also be reduced by increasing the pass frequency. Especially, it is more effective to perform roll working with the pass frequency of more than four times. In other words, the pressure reduction of 40% or smaller in each roll working will increase dimensional precision of each wire after being rolled.

FIFTH EXAMPLE

Figure 13:
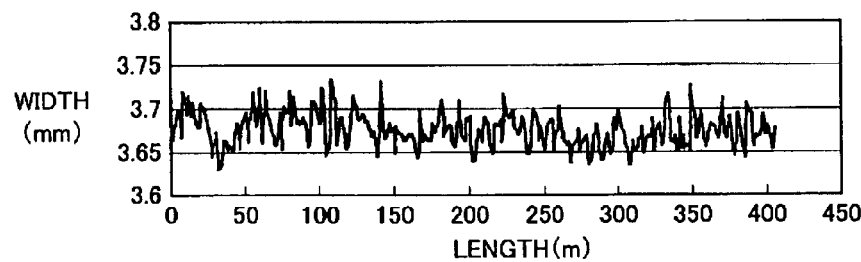
FIG. 13 is a graph showing changes in width against length of an oxide superconducting wire rolled using a lubricant of high volatility as an embodiment of the present invention.
Figure 14:
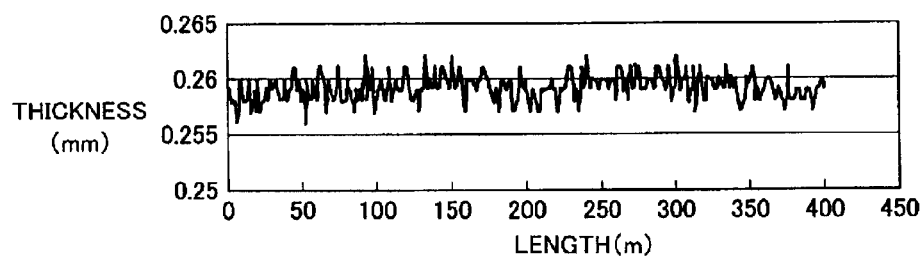
FIG. 14 is a graph showing changes in thickness against length of an oxide superconducting wire rolled using a lubricant of high volatility as an embodiment of the present invention.
Figure 15:
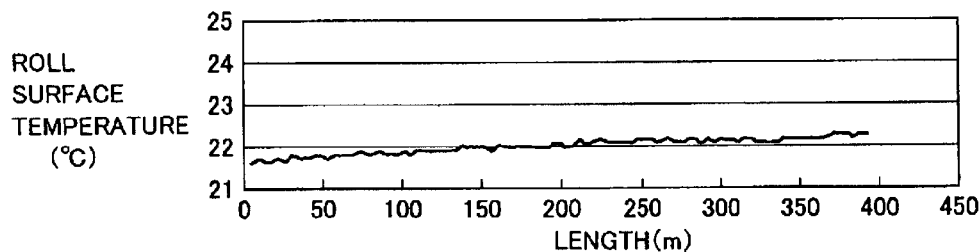
FIG. 15 is a graph showing changes in temperature of roll surface against length of an oxide superconducting wire rolled using a lubricant of high volatility as an embodiment of the present invention.

Each roll working of the fourth example was performed using a pressure roll having grooves for widthwise conchanges in width against length of the obtained oxide superconducting wire are shown in FIG. 13, changes in thickness against length of the oxide superconducting wire are shown in FIG. 14, changes in roll surface temperature against length of the oxide superconducting wire are shown in FIG. 15. From FIGS. 13 to 15, it can be appreciated that with a highly volatile lubricant, the increase of the roll surface temperature caused by the processing heat can be minimized, and correspondingly dimension of width or thickness of the wire can be kept within a prescribed range of precision.

SEVENTH EXAMPLE

To the wire manufactured by roll working with four times of pass frequency in the fourth example, further roll working was performed by four-directional pressure rolls for widthwise constraint.

As a result, the average value of width dimension of the obtained wire was 3.71 mm, standard deviation was 0.01 mm, maximum value was 3.73 mm, minimum value was 3.68 mm, the average value of thickness dimension was 0.255 mm, standard deviation was 0.001 mm, maximum value was 0.260 mm, and minimum value was 0.253 mm. The dimension precision of width or thickness could further be improved from that of the fourth example.

INDUSTRIAL APPLICABILITY

As described above, by utilizing the manufacturing method of an oxide superconducting wire of the present invention, dimensional precision of width or thickness of the oxide superconducting wire eventually obtained can be improved, and further, superconducting performance such as critical current can be improved. Thus, when the wires produced by the present invention are applied to magnets or cables as practical use of the oxide superconducting wires, coil shape of the magnets is improved, and additionally, in case of cables, the problem of degrading superconducting property can be prevented without generating stress.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an oxide superconducting wire, comprising the steps of:
   preparing a composite by covering with metal powder containing an oxide superconductor or raw material for an oxide superconductor; and
   rolling said composite using a lubricant having kinematic viscosity of at most $20 \times 10^{-6}$ mm$^2$/s.

2. The method of manufacturing an oxide superconducting wire according to claim 1, wherein
   said kinematic viscosity is at most $10 \times 10^{-6}$ mm$^2$/s.

3. The method of manufacturing an oxide superconducting wire according to claim 1, wherein
   said lubricant has a boiling point of at most 200° C.

4. The method of manufacturing an oxide superconducting wire according to claim 1, wherein
   the step of rolling includes rolling said composite with pressure reduction of at most 40%.

5. The method of manufacturing an oxide superconducting wire according to claim 1, wherein
   the step of rolling includes rolling said composite using pressure rolls having grooves for constraining width of said composite.

6. The method of manufacturing an oxide superconducting wire according to claim 1, wherein
   the step of rolling includes rolling said composite using four-directional pressure rolls.

7. The method of manufacturing an oxide superconducting wire according to claim 1, wherein
   the step of preparing said composite includes filling into a metal pipe powder containing an oxide superconductor or raw material for an oxide superconductor.

8. The method of manufacturing an oxide superconducting wire according to claim 7, wherein
   the step of preparing said composite includes preparing a monofilamentary composite by filling into a first metal pipe powder containing an oxide superconductor or raw material for oxide superconductor, and preparing a multifilamentary composite by filling a plurality of said monofilamentary composites into a second metal pipe.

9. The method of manufacturing an oxide superconducting wire according to claim 8, wherein
   the step of preparing said composite further includes drawing said monofilamentary composite, and
   the step of preparing said multifilamentary composite includes filling a plurality of said drawn monofilamentary composite in said second metal pipe.

10. The method of manufacturing an oxide superconducting wire according to claim 9, wherein
    the step of preparing said composite further includes drawing said multifilamentary composite.

11. The method of manufacturing an oxide superconducting wire according to claim 1, wherein
    said metal pipe is a silver or silver alloy pipe.

12. The method of manufacturing an oxide superconducting wire according to claim 1, wherein
    said oxide superconductor is a bithmuth-based oxide superconductor.

13. The method of manufacturing an oxide superconducting wire according to claim 12, wherein
    said bithmuth-based oxide superconductor includes bithmuth, lead, strontium, calcium, and copper having a (bithmuth and lead):strontium:calcium:copper composition ratio approximately expressed as 2:2:2:3.

14. The method of manufacturing an oxide superconducting wire according to claim 1, further comprising the steps of:
    thermally treating said rolled composite.

* * * * *